United States Patent [19]

Baker et al.

[11] Patent Number: 4,852,062
[45] Date of Patent: Jul. 25, 1989

[54] EPROM DEVICE USING ASYMMETRICAL TRANSISTOR CHARACTERISTICS

[75] Inventors: Frank K. Baker; James R. Pfiester, both of Austin; Charles F. Hart, Pflugerville, all of Tex.

[73] Assignee: Motorola, Inc., Schaumburg, Ill.

[21] Appl. No.: 101,875

[22] Filed: Sep. 28, 1987

[51] Int. Cl.[4] .............................................. G11C 11/40
[52] U.S. Cl. ..................................................... 365/185
[58] Field of Search ........................................ 365/185

[56] References Cited

U.S. PATENT DOCUMENTS

| 4,004,159 | 1/1977 | Rai et al. | 365/185 |
| 4,462,090 | 7/1984 | Iizuka | 365/185 |
| 4,532,532 | 7/1985 | Jackson | 357/15 |
| 4,555,843 | 12/1985 | Malhi | 29/571 |
| 4,616,340 | 10/1986 | Hayashi et al. | 365/185 |
| 4,688,078 | 8/1987 | Hseih | 365/185 |
| 4,794,565 | 12/1988 | Wu et al. | 365/185 |

OTHER PUBLICATIONS

A. T. Wu, et al., "A Source-Side Injection Erasable Programmable Read-Only-Memory Device (SI-E-PROM)," *IEEE Electron Device Letters*, vol. ED-7, No. 9, Sep. 1986, pp. 540-542.

Primary Examiner—James W. Moffitt
Attorney, Agent, or Firm—John A. Fisher

[57] ABSTRACT

An erasable programmable read only memory (EPROM) cell having a floating gate and a control gate where the floating gate and the control gate are deliberately offset or asymmetrical from the source/drain and drain/source regions in the substrate. During programming, the source region is the one spaced apart from the gates while the drain region is aligned thereto. This orientation produces high gate currents to provide faster programming. During a read operation the aligned region now becomes the source and the spaced apart region becomes the drain to provide high drain currents for fast access. The asymmetrical EPROM cells of the present invention may be readily made using conventional spacer technology.

14 Claims, 9 Drawing Sheets

$I_{SUBSTRATE}$ AND $I_{GATE}$ v. $V_{GATE}$
FOR FIG. 2 EPROM DEVICE

Id v. Vd
FOR THREE
CONFIGURATIONS
OF FIG. 4

FIG. 6

$I_{SUB}$ AND
$I_g$ v. $V_g$
FOR THREE
CONFIGURATIONS
OF FIG. 4

EPROM DEVICE USING ASYMMETRICAL TRANSISTOR CHARACTERISTICS

FIELD OF THE INVENTION

The invention relates to integrated circuit structures, and relates more particularly to field effect transistor (FET) structures used in erasable programmable read only memory (EPROM) cells.

BACKGROUND OF THE INVENTION

EPROMs are well known types of read-only-memories that may be programmed electrically. A unique feature of an EPROM is that it retains data even with the power disconnected but can be erased by exposure to short wavelength ultraviolet light, and may be reprogrammed many times.

Typically, an EPROM cell has two conductive material gates: a floating gate and a control gate. The floating gate stores the information of the cell. The gates are typically made from doped polycrystalline silicon (polysilicon), metal, refractory metal silicide, etc. and combinations thereof.

Figure 2:
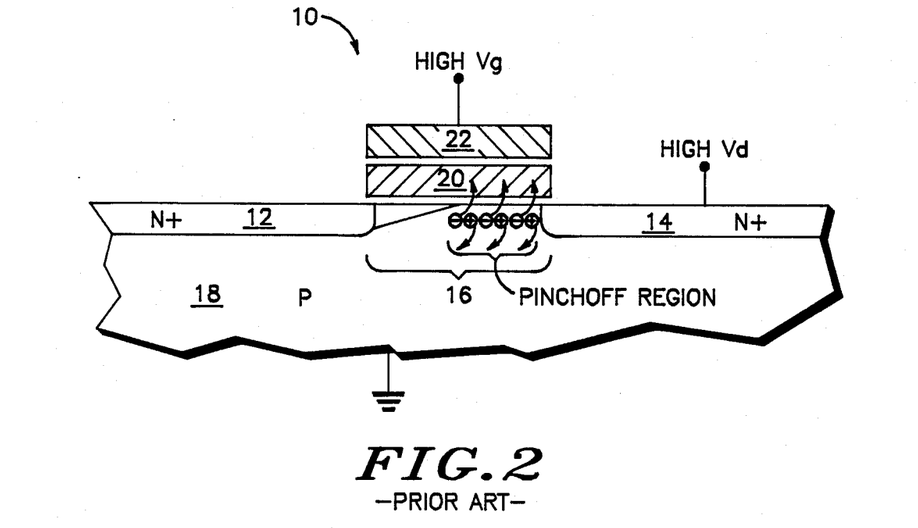
FIG. 2 is a schematic cross section illustration of a conventional EPROM cell, showing an overlap of the source and drain regions by the gates.

Conventional EPROM cells use highly energetic carriers or "hot" carriers produced by a "drain avalanche field" to inject charge into the floating gate, as seen in FIG. 2. Shown in FIG. 2 is a schematic diagram of a conventional EPROM cell 10 with source region 12 and drain region 14 separated by a channel 16 within a semiconductor substrate 18. The control gate 22 is positioned over the floating gate 20 which has charge injected therein by the high electric field at the drain end of the channel 16.

Figure 3:
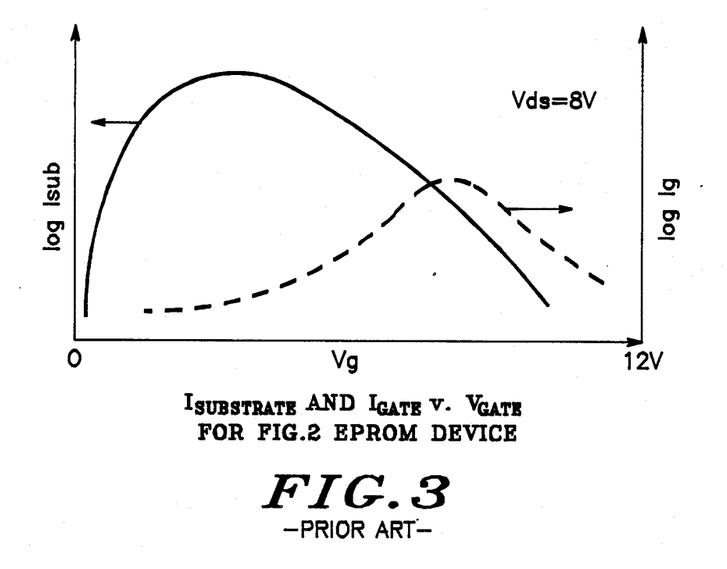
FIG. 3 is a plot of substrate current, $I_{sub}$, and gate current, $I_g$, v. gate voltage, $V_g$, for the conventional EPROM cell of FIG. 2.

Problems with conventional EPROM cells such as 10 in FIG. 2 include the conflict shown qualitatively in the chart of FIG. 3 in which log $I_{sub}$ and log $I_s$ are plotted as functions of $V_g$. The substrate current, $I_{sub}$, and the gate current, $I_g$, peak at the lower and higher values of gate voltage, $V_g$, respectively as shown. $V_g$ and $V_d$ are at odds to control the vertical electric field, therefore high $V_g$ is needed to obtain high $I_g$. To get high vertical electric field in the correct direction for electron injection, we need high $V_g$. Additionally, however, high $V_d$ is required to produce impact ionization "Impact ionization" is a term which refers to the process by which a high electric field produces highly energetic or "hot" electrons and holes. To get a large lateral electric field in the channel, $V_g$ needs to be approximately equal to $(V_d/2)$, and that actually, $I_g$ peaks for a $V_g$ greater than $(V_d/2)$. Both of these conditions are needed to produce high gate current. As a result, high operating voltages are needed, and programming is slow on large memory chips. These characteristics are contradictory to the desired characteristics of EPROM memory chips, which include low programming voltages and fast programming; also desired for easy testing of EPROM chips.

SUMMARY OF THE INVENTION

Accordingly, it is an object of the present invention to provide an EPROM cell which can be programmed relatively quickly and can be programmed with relatively low voltages, in comparison with conventional EPROM cells.

Another object of the invention is to obtain the above object without a reduction in drain current during the read operation, as compared with a conventional MOSFET.

It is another object of the present invention to provide an improved EPROM cell with low programming voltage and fast programming time which can be readily integrated into conventional fabrication processes.

Still another object of the present invention is to provide an improved EPROM cell which consumes a minimum of lateral area by enabling various interconnect or metallization lines to perform multiple functions.

In carrying out these and other objects of the invention, there is provided, in one form, an asymmetrical erasable programmable read only memory (EPROM) cell on a semiconductor substrate doped with an impurity of a first conductivity type and having a surface. A source/drain region and a drain/source region are present in the semiconductor substrate. The source/drain region and the drain/source region are doped with an impurity of a second semiconductor type, and are spaced apart from each other by a channel between their inner edges. A gate dielectric material is present on the surface of the semiconductor substrate covering the channel. A floating gate of conductive material exists on the gate dielectric material over the channel, and is positioned such that the floating gate overlaps the inner edge of the drain/source region and is spaced apart from the inner edge of the source/drain region. A control gate of a conductive material is positioned over and insulated from the floating gate.

BRIEF DESCRIPTION OF THE DRAWINGS

FIG. 1A is a schematic circuit diagram of part of an EPROM circuit that a cell of FIG. 1 would be used in;

It should be noted with respect to the cross section illustrations of the device structures that they are not necessarily to scale, and that the vertical dimensions may be exaggerated relative to the horizontal dimensions for clarity.

DETAILED DESCRIPTION OF THE INVENTION

Figure 4:
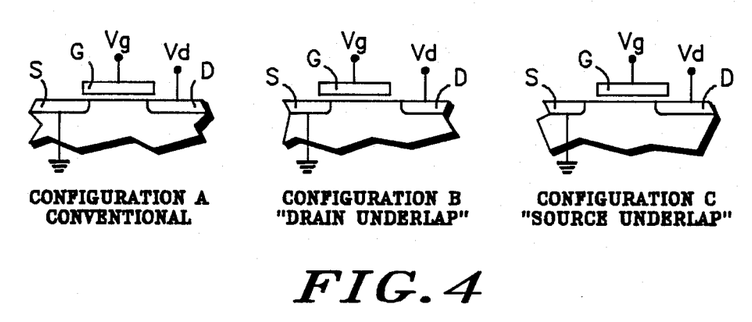
FIG. 4 shows three schematic cross section illustrations of various gate configurations, showing various degrees of gate overlap of the source and/or drain regions.

Shown in FIG. 4 are three possible configurations of a field effect transistor (FET) with respect to how the gate electrode is oriented relative to the source and drain regions on either side. Configuration A depicts a FET where the gate overlaps both the source and drain, while configuration B shows a structure where the gate overlaps only the source. This latter condition is called "drain underlap" herein, while configuration C illustrates another arrangement where the gate electrode overlaps only the drain—a condition called "source underlap".

These structures have been studied by researchers in the art to some extent, since it is likely that in the fabrication of FETs the gates will be misaligned relative to the source and drain regions. In the fabrication of FETs it is useful to understand how the process may vary and how the resulting circuit may behave as a result of the inadvertent variations.

Figure 5:
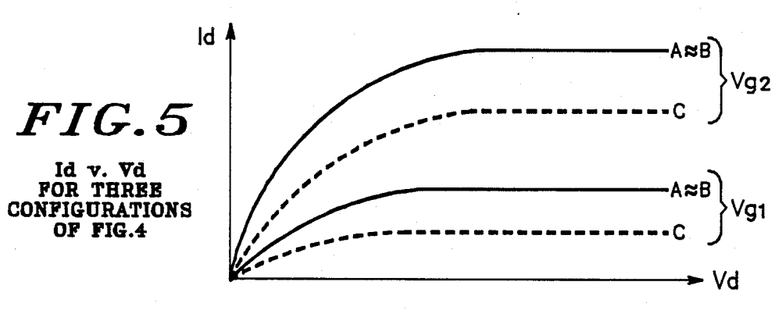
FIG. 5 is a plot of drain current, $I_d$, v. drain voltage, $V_d$, for the three configurations of FIG. 4.
Figure 6:
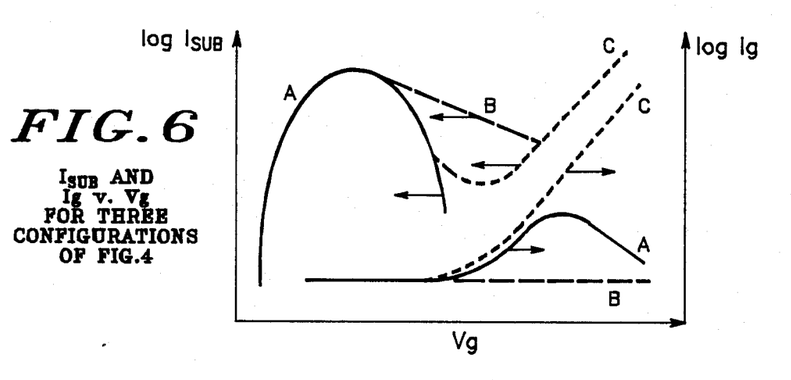
FIG. 6 is a plot of substrate current, $I_{sub}$, and gate current, $I_g$, v. gate voltage, $V_g$, for the three configurations of FIG. 4.

FIG. 5 shows how the drain current for configurations A, B and C depends on drain voltage and gate voltage. Uniformly, configurations A and B, approximately equal, provide the highest drain current for a given $V_d$ and $V_g$, while configuration C provides the lowest. Higher $I_d$ is preferred during read operations. Shown in FIG. 6 are the qualitative relationships of substrate current, $I_{sub}$ and gate current, $I_g$ as a function of $V_g$. As may be seen, $I_{sub}$ for configuration C is intermediate to configurations A and B and then exceeds both as $V_g$ increases. $I_g$ for configuration C agrees with that of configurations A and B and then exceeds both greatly as $V_g$ increases. Note that configuration C gives large values of both $I_{sub}$ and $I_g$ for high values of $V_g$, which are desirable during the programming operation of the EPROM. Thus, the problem discussed with respect FIG. 3, concerning optimizing both $I_{sub}$ and $I_g$ simultaneously might be solved with a configuration C device.

With configuration B showing drain underlap, $I_d$ is degraded little, if any. The gap between channel and drain is similar to a pinch off region. As shown in FIG. 6, $I_{sub}$ stays large at high $V_g$. $I_g$ itself is not enhanced since the vertical electric field opposes hot carrier injection (HCI). In fact, $I_g$ is reduced below the "normal" value achieved with configuration A. With configuration C showing source underlap, $I_d$ is degraded 5 to 75% depending on the gap width, t. As shown in FIG. 6, $I_{sub}$ falls, but shows a second rise at high $V_g$ due to the lateral electric field at the source. The vertical electric field is now favorable to hot electron injection, therefore, $I_g$ increases even at relatively "low" values of $V_d$ and $V_g$.

These characteristics are known for asymmetrical devices. These investigations suggested to the inventors a cell similar to configuration C would be good for the programming of an EPROM device, while a cell similar to configuration B would be good for the reading of the EPROM. Configuration B is ideal for the read operation because of high $I_d$ and low $I_g$ while configuration C is ideal for programming because of high $I_{sub}$ and $I_g$. While the above discussion with respect to FIGS. 4 through 6 relates to known principles of asymmetrical MOSFET devices, it remained for the inventors herein to discover how these characteristics could be incorporated into a useful EPROM device.

Figure 1:
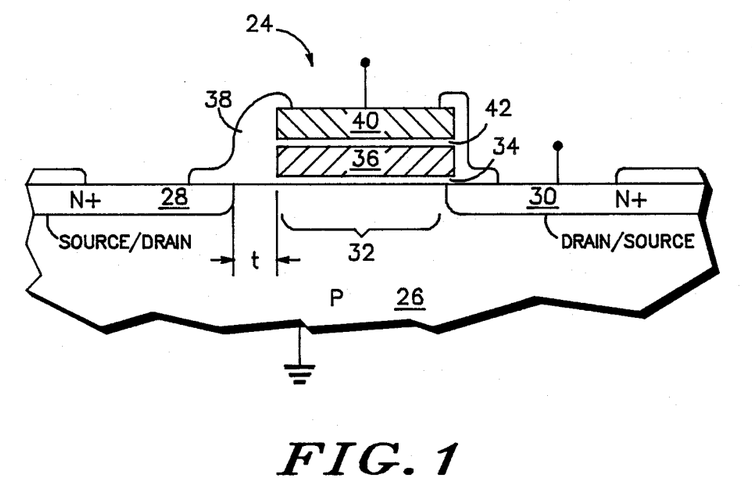
FIG. 1 is a schematic cross section illustration of one realization of the asymmetrical EPROM cell of the present invention.

Shown in FIG. 1 is an EPROM cell 24 of the present invention fabricated in semiconductor substrate 26. N+source/drain region 28 and n+drain/source region 30 in the substrate 26 are separated by channel 32, and a gap region, marked t. The channel 32 is covered by a thin dielectric layer 34 surmounted by a conductive material layer forming floating gate 36. Note that floating gate 36 is offset and not centered over channel 32; gate 36 being closer to and overlapping drain/source region 30 and spaced from source/drain region 28 by spacer 38 to form an intentionally asymmetric device. Floating gate 36 is insulated from control gate 40 by thin dielectric layer 42.

For purposes of illustration only, semiconductor substrate 26 may be monocrystalline silicon and floating gate 36 and control gate 40 may be doped polycrystalline silicon (polysilicon) or other conductive material such as metal or refractory metal silicide. Dielectric layers 34 and 42 may be silicon dioxide, silicon nitride, a combination of the two, or the like. Spacer 38 may be a sidewall spacer formed by the provision of a uniform conformal layer and a subsequent anisotropic etch. The thickness of the conformal layer helps determine the thickness, t, of spacer 38. Other known methods for forming spacers, such as selective growth or selective deposition, may be used to form spacer 38. Spacer 38 should be of a material that does not store much charge. In some processes useful for making the structure of this invention, this material should be removable. Dielectric material, such as silicon dioxide, silicon nitride, combinations of oxide and nitride, etc. are immediately suggested, although other materials may be suitable. More will be explained about processes for fabricating the inventive EPROM cell 24 later.

During the programming or writing of EPROM cell 24, source/drain region 28 acts as the source and drain/source region 30 acts as the drain and $I_g$ is enhanced. This effect is confirmed by the curves on the right side of FIG. 6. Conversely, during the reading of the cell 24, source/drain region 28 is the drain, drain/source region 30 is the source, and $I_d$ is high while $I_g$ is low. The low $I_g$ helps prevent accidental programming during a read operation. Thus, the present structure provides optimal $I_g$ during programming, and optimal $I_d$ and $I_g$ during read operations.

Figure 1A:
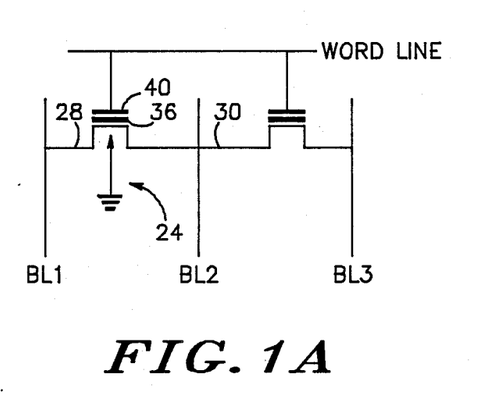

The cycle will be described again with reference to the schematic circuit diagram of FIG. 1A. Bit line 1 (BL1) is grounded during programming and bit line 2 (BL2) has 5 V or more applied thereto, in one embodiment as high a voltage as possible, and the word line is ramped to 5 V or more. BL3 is allowed to float so that the next, adjacent cell will not be programmed. The gate 40 of the present EPROM structure may be pumped. During the read operation, BL2 is grounded, BL1 is routed to the sense amplifiers on the periphery of chip (not shown) and the word line is ramped to approximately 5 V. There would need to be special circuitry in the periphery to permit the source/drain and drain/source regions to change functions in the described grounding of alternate bit lines to perform the write and read operations. Such circuitry are called virtual ground systems, and such systems are already known in the art with respect to ROM arrays.

There is known an EPROM cell which has a thin conductive floating spacer or sidewall instead of the dielectric one of the present invention, see A. T. Wu, "A Source-Side Injection Erasable Programmable Read-Only Memory (SI-EPROM) Device," *IEEE Electron Device Letters*, Vol. EDL-7, No. 9, September 1986, pp. 540–542. Besides the differences in the character of the spacer, the present inventive EPROM cell is distinct from the SI-EPROM cell in that the former is easier to fabricate. Further, the present invention reverses the source and drain to achieve higher drain currents during a read operation. Wu, et al. do not mention any such innovation. The SI-EPROM device produces a read current of about 100 microamps (uA) per micron (um) of width with $V_g$ of about 5 V and $V_d$ of about 2 V. This is about 60% lower than the current produced by a standard metal-oxide-semiconductor field-effect-transistor (MOSFET) of similar channel length and gate oxide thickness with these biases. Additionally, the SI-EPROM device must be read at moderate gate and drain voltages to avoid accidental programming. By reversing the source and drain between write and read operations, the present invention avoids these problems. The present invention is able to obtain higher cell current in read mode than conventional EPROMs because the channel doping can be lower. Conventional EPROM cells need a high electric field at the drain edge to charge the floating gate. High doping concentration in the channel increases this electric field and is a typical feature. However, with the intentionally asymmetrical device of the present invention, high channel doping is not required.

The EPROM device 24 in FIG. 1 can be fabricated using a removable sidewall lightly doped drain (LDD) type of technology, as shown in the two sequences illustrated in FIGS. 7 through 16. This process can be easily integrated with normal LDD formation in the periphery.

FIGS. 13 through 16 will provide a first, somewhat simple fabrication sequence for the EPROM cell of the present invention illustrating more particularly how the process may be integrated into a process for making devices in the array and the periphery of an EPROM chip.

Figure 13:
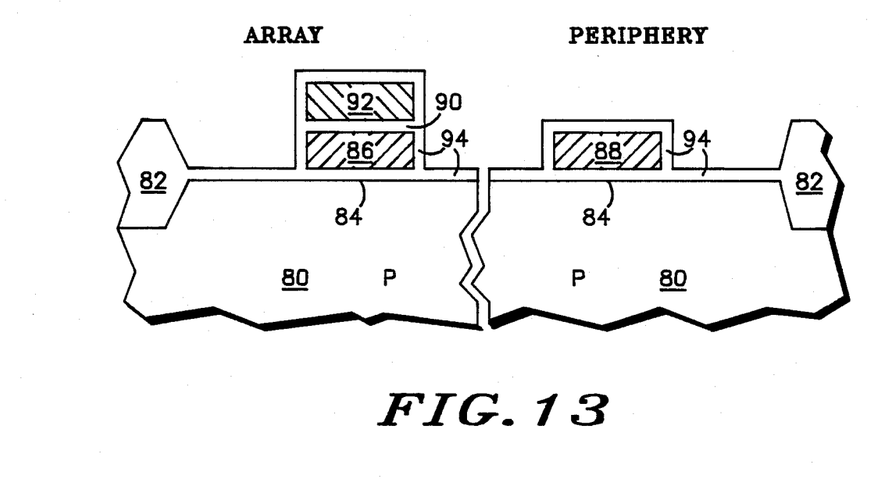
FIG. 13 is a schematic cross section illustration of another conventional memory structure which may be used as a starting point to make the asymmetrical EPROM cells of the present invention, showing a stacked gate structure for the EPROM array devices and a single conductive gate for the devices in the array of the memory to demonstrate compatibility with conventional processes.

Shown in FIG. 13 is a semiconductor substrate 80 split into array and periphery portions for the purposes of illustration. Isolation regions 82 are already provided, as are thin gate dielectric layers 84 and floating gate 86 on the array side and gate 88 on the periphery side. Gates 86 and 88 may be formed from the same conductive material, which here will be referred to as first doped polysilicon layer. However, gate 88 may also be formed from the same layer as gate 92. For the purposes of this invention, there is no particular preference. Also, an interlayer dielectric layer 90 separates floating gate 86 from control gate 92. Isolation over the entire structure is provided by thin dielectric layer 94. Thicknesses such as those used in FIG. 7 may be used here, but should not be considered limiting.

Figure 14:
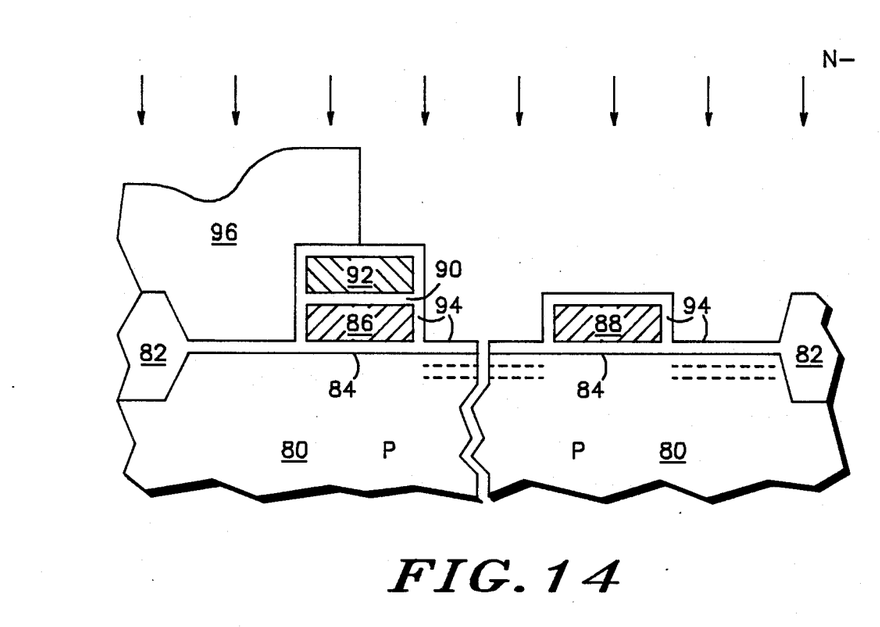
FIG. 14 is a schematic cross section depiction of the FIG. 13 structure, during an n−implantation step, after part of the double gate structure has been masked.

The next steps are illustrated in FIG. 14 which shows a patterned photoresist layer 96 covering the left half of the array device. As will be shown in the discussion of the second process embodiment, the opposing array devices can be built back-to-back to help conserve lateral space in the layout of the cell. Layer 96 serves as a mask during the implantation of n-type impurity dopants such as arsenic or phosphorus, schematically indicated by the downward arrows and the dashed lines near the surface of substrate 80. A typical n−dose might be about 1E13 to 1E14 atoms/cm$^2$ arsenic or phosphorus at implantation energies of 40 to 80 keV. For the periphery devices, this implantation introduces the dopant that will eventually form the LDD portion of the source and drain regions. An LDD will also be formed adjacent the right side of gates 86/92, but not adjacent the left side. Conventionally, the periphery LDD implant is from 1E13 to 1E14 atoms/cm$^2$, whereas the source and drain regions for the standard periphery device take a dose of 3 to 8E15 atoms/cm$^2$, typically. Again, the processes for making the structures of the present invention integrate well with using LDDs in the periphery devices, and implants ranging from light phosphorus implants to heavy arsenic implants may be employed. The method of the invention may also be integrated with a process that employs only n+source/drain implants in the periphery of an array if heavy As+ is used for all implants.

The implant prior to spacer formation can be chosen to obtain the desired n+ sheet resistance, or it can be kept low (approximately 1E13 to 1E14 atoms/cm$^2$) to allow LDD formation in the periphery simultaneously with formation of the EPROM device.

Figure 15:
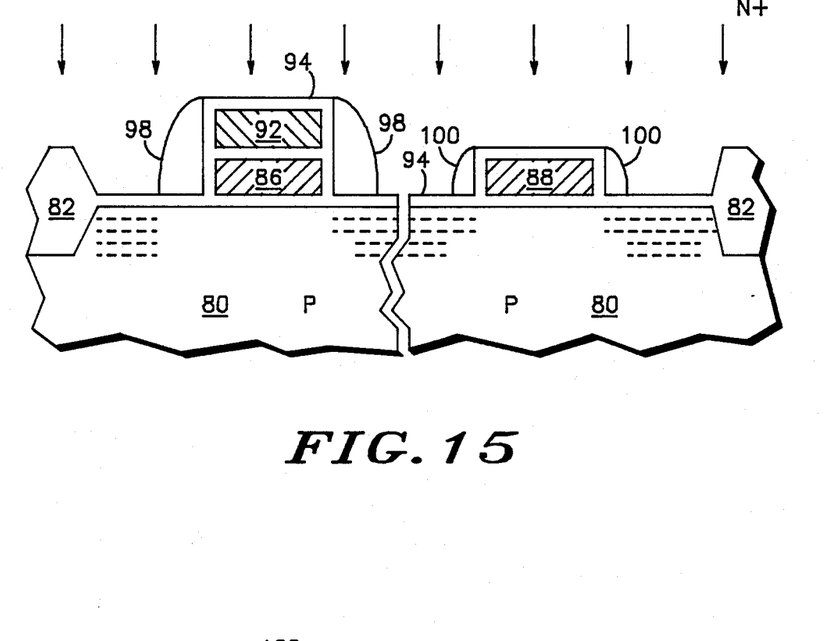
FIG. 15 is a schematic cross section illustration of the FIG. 14 device under construction after the removal of the mask of FIG. 14 and the provision of sidewall spacers surrounding both gate types, and during the introduction of the n+impurity for the bulk of the source/drain and drain/source regions.
Figure 16:
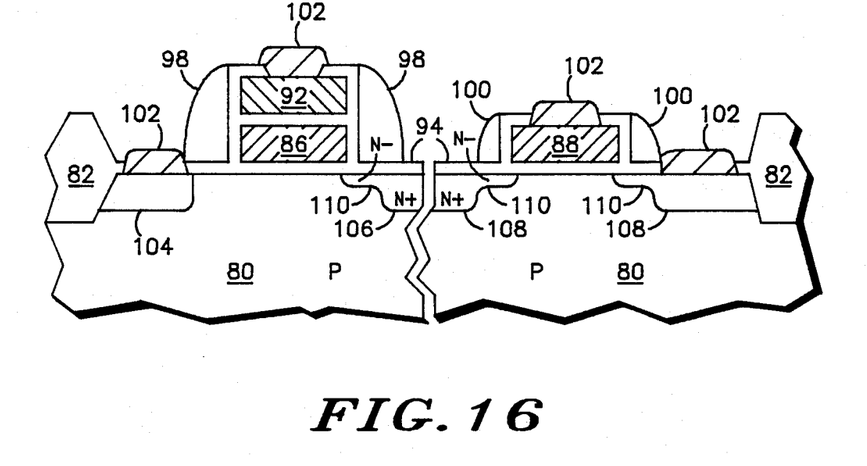
FIG. 16 depicts a cross section of an alternate embodiment of the present asymmetrical EPROM device invention made in accordance with the steps illustrated in FIGS. 13 through 15.

From the FIG. 14 structure, the photoresist pattern 96 is stripped and spacers 98 and 100 are formed as described earlier, such as by conformal deposit of a dielectric such as low temperature oxide (LTO) and an anisotropic etch. The resulting structure is shown in FIG. 15 during a second n-type impurity implantation to form the n+source and drains. Note that the area of impurity in the surface of substrate 80 is aligned to the gates except for the left side of gates 86/92 which is spaced apart therefrom to provide the asymmetrical EPROM device in the array. This second implant may be done at an arsenic or phosphorus dose of 1E15 to 5E15 atoms/cm$^2$ at 80 keV.

Openings to make contact to the various gates and regions are next etched and a conductive material is provided thereover for electrical contact. Optionally, a refractory metal may be provided over the structure, since there is no reason that sided contacts may not be used. In fact, the use of a refractory metal silicide may enhance the ability to operate the cell in its bidirectional manner.

Figure 7:
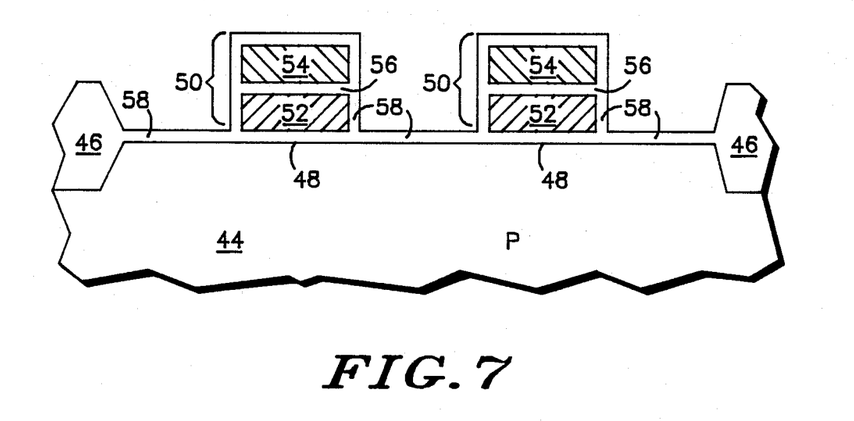
FIG. 7 is a schematic cross section illustration of a starting point for fabricating the asymmetrical EPROM cell of the present invention using a conventional stacked gate structure.

An alternate process for making the EPROM cells of the invention will now be discussed with respect to FIGS. 7 through 12. Shown in FIG. 7 is a semiconductor substrate 44 having dielectric isolation regions 46 formed therein and a thin gate dielectric layer 48 formed over the surface thereof. The standard EPROM stack 50 consists of floating gate 52 of conductive material separated from control gate 54 by a thin dielectric layer 56. A thin dielectric layer 58 is formed over the stack as well as the exposed surface of substrate 44.

For the purposes of illustration only, some suggested thicknesses and materials for these various features will be given, although it will be understood that other thicknesses would provide a useful and functional EPROM cell within the scope of the invention. For example, the thin gate dielectric layer 48 may be about 250 Angstroms of silicon dioxide and the floating gate 52 may be about 3000 Angstroms of doped polysilicon. The "interpoly" dielectric layer 56 may be about 400 Angstroms of SiO$_2$ while the control gate may also be about 3000 Angstroms of doped polysilicon. Thin dielectric layer 58 may be about 300 Angstroms of silicon dioxide or polysilicon oxide.

Figure 8:
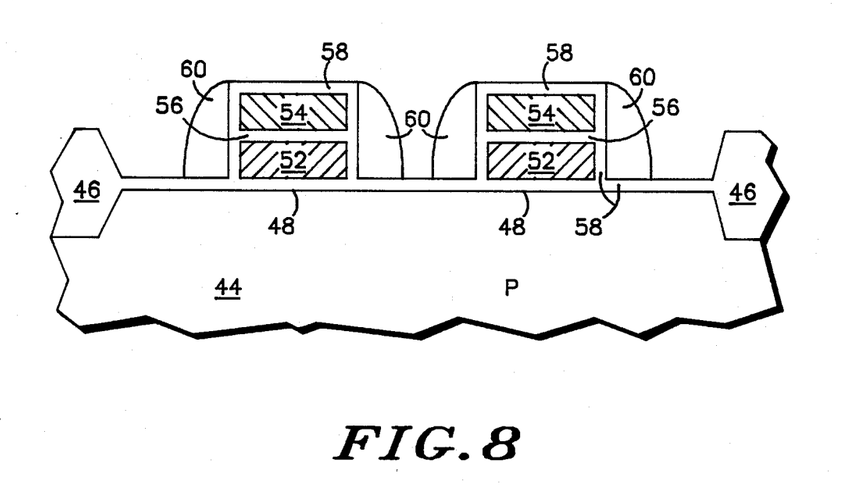
FIG. 8 is a schematic cross section illustration of the EPROM cell of the present invention under construction after sidewall spacers have been added to the stacked gates of FIG. 7.

Shown in FIG. 8 is the structure of FIG. 7 after spacers 60 have been formed thereon. As suggested earlier, various methods are known to form such spacers, sometimes called sidewall spacers. One recommended procedure is to deposit a uniform, conformal layer of about 3000 Angstroms of silicon dioxide or silicon nitride over the FIG. 7 structure. An anisotropic etch, such as a reactive ion etch (RIE) step that stops on silicon dioxide layer 58, is performed to form the spacers 60 seen in FIG. 8. As mentioned, the thickness of the conformal layer determines the thickness of spacers 60. This thickness will determine the extent to which the gates are offset or asymmetrical.

Figure 9:
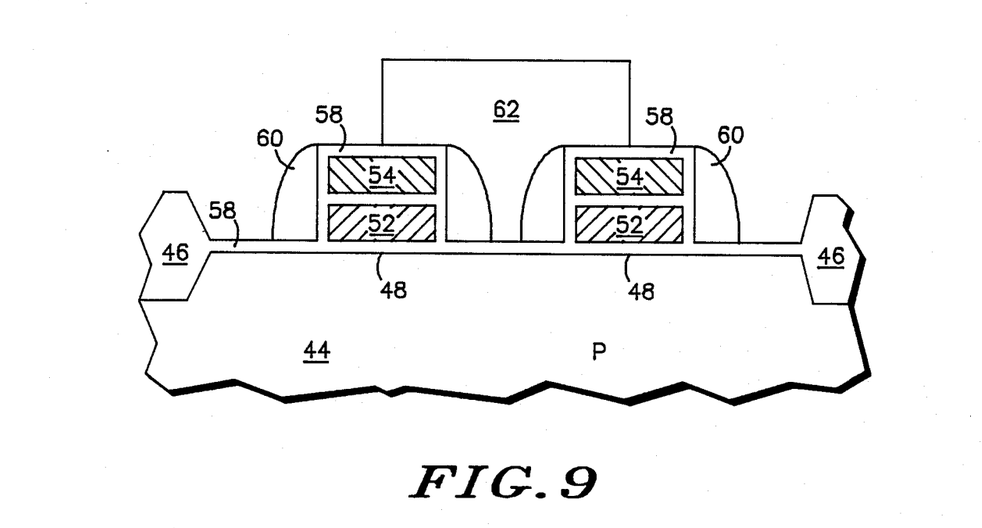
FIG. 9 is a schematic cross section illustration of the FIG. 8 structure masked for removal of part of the sidewall spacers from one side of the stacked gates.

Next, the spacer 60 on one side of the gates 52 and 54 must be removed. It will be convenient for lateral space conservation and layout reasons to remove the spacers 60 from opposing sides of pairs of the gates 52/54. For example, shown in FIG. 9 is the structure of FIG. 8 with a photoresist pattern 62 straddling the gate pair. In one embodiment, the photoresist pattern 62 extends across approximately half of each gate. That is, if the gate length is 1 um, the distance photoresist pattern 62 extends thereover should be about 0.5 um. Photoresist pattern 62 should be formed in a manner well known in the art. Typically, this involves forming a uniform layer of photoresist, masking and exposing either the portions to remain or the portions to be removed, and removing the unwanted portions. It will be appreciated, of course, that the process to make the asymmetrical EPROM cell of the present invention is not required to form spacers on opposite sides of the gates, although this might be one attractive alternative.

Figure 10:
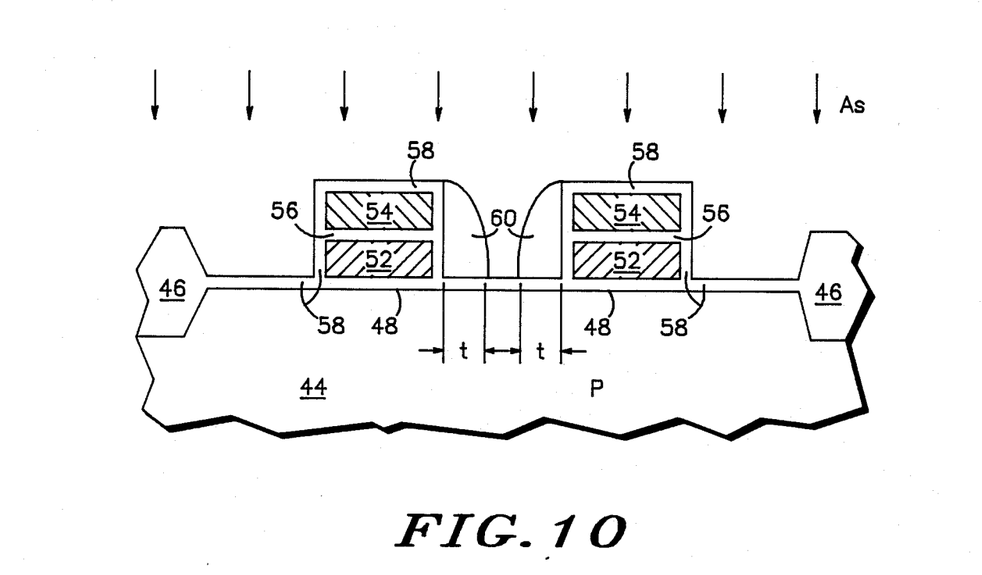
FIG. 10 is a schematic cross section depiction of the FIG. 9 structure after part of the sidewall spacers from one side of the gates have been removed and during the source/drain and drain/source implantation step.

Shown in FIG. 10 is the result of the removal of the exposed spacers 60 by an etch such as a dry, isotropic etch that stops on insulating layer 58. After the strip of the photoresist pattern 62, the inner spacers 60 remain to form the asymmetrical EPROM devices. Also shown in FIG. 10 is the implantation of arsenic, schematically illustrated, to form the source/drain and drain/source regions. A typical, suggested dose of arsenic for this purpose is 5E15 (5×10$^{15}$) atoms/cm$^2$ at 80 keV. Note that since the inner spacers 60 remain, the inner drain/source region will be offset from the gates 52/54 by the thickness of spacers 60.

Figure 11:
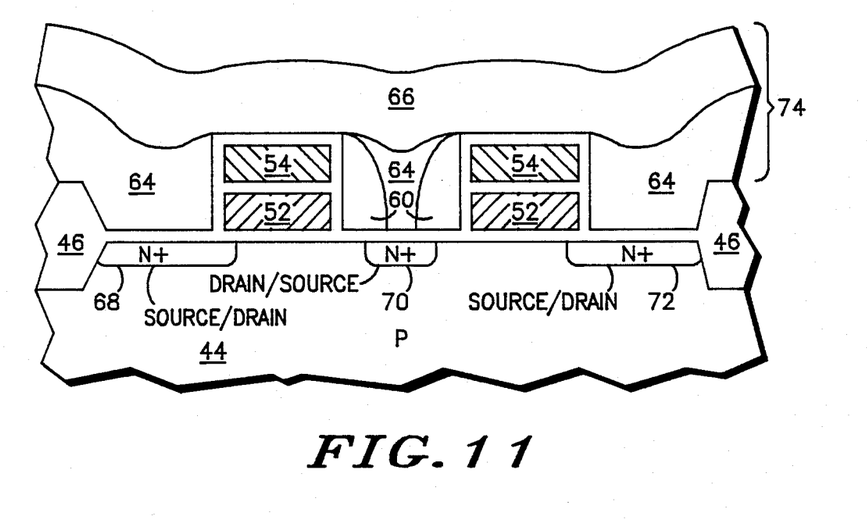
FIG. 11 is a schematic cross section illustration of the structure of FIG. 10 after the source/drain region and drain/source region have been annealed and dielectric layers have been added; note the overlap of the source/drain regions by the gates.

As shown in FIG. 11, a dielectric layer 74 is next provided, which may be done in two stages, such as the deposit of a spin on glass (SOG) layer 64 and a borophosphosilicate glass (BPSG) layer 66. After annealing at an illustrative period of thirty minutes at 900° C., source/drain region 68, drain/source region 70 and source/drain region 72 shown in FIG. 11 are formed. It will be appreciated that any combination of glass materials would work, other than those specifically mentioned herein.

Figure 12:
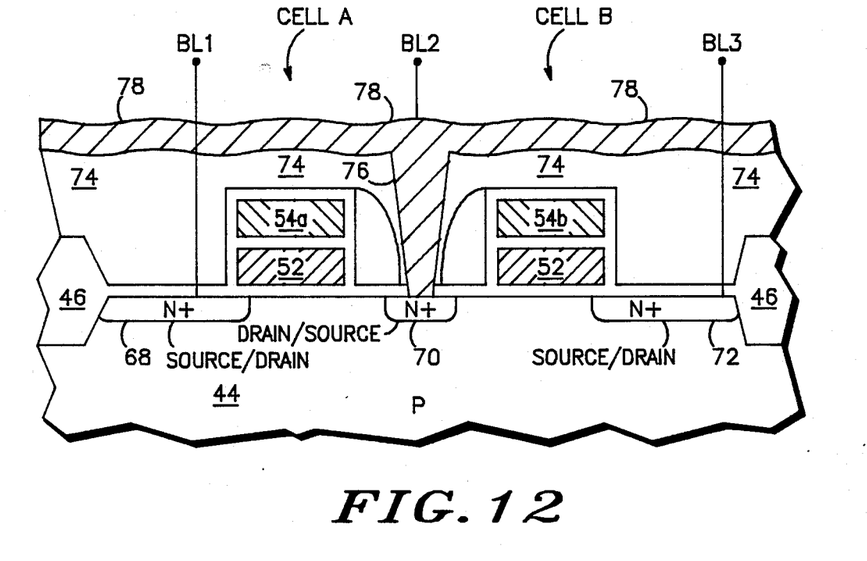
FIG. 12 is a schematic cross section view of the FIG. 11 structure after contacts have been cut and conductive contact has been made to the source/drain and drain/source regions.

Next contacts 76 are etched through dielectric layer 74 and metal layer 78 is provided into contacts 76 and patterned to contact the n+ regions 68, 70 and 72, as shown in FIG. 12. Layer 78 may be some other conductive material such as aluminum, doped polysilicon or a refractory metal silicide.

Referring to FIG. 12, a read operation from cell A would connect BL1 and BL3 to ground, ramp the voltage on polysilicon gate 54a to 5 V and sense the voltage at BL2. Reading from cell B would involve grounding BL3 and BL1 and ramping polysilicon gate 54b to 5 V, for example, and sensing BL2. Further, programming or writing cell A involves connecting BL2 to ground or $V_{cc}$, placing about 8 V on BL1 and ramping the voltage on polysilicon gate 54a to about 8 to 10 V. BL3 is left floating so that the adjacent cell will not be programmed. Likewise, to program cell B, BL2 is tied to ground or $V_{cc}$, a voltage is placed on BL3 and the voltage on polysilicon control gate 54b is ramped to about 8 to 10 V. In this case, BL1 is left floating.

Figure 17:
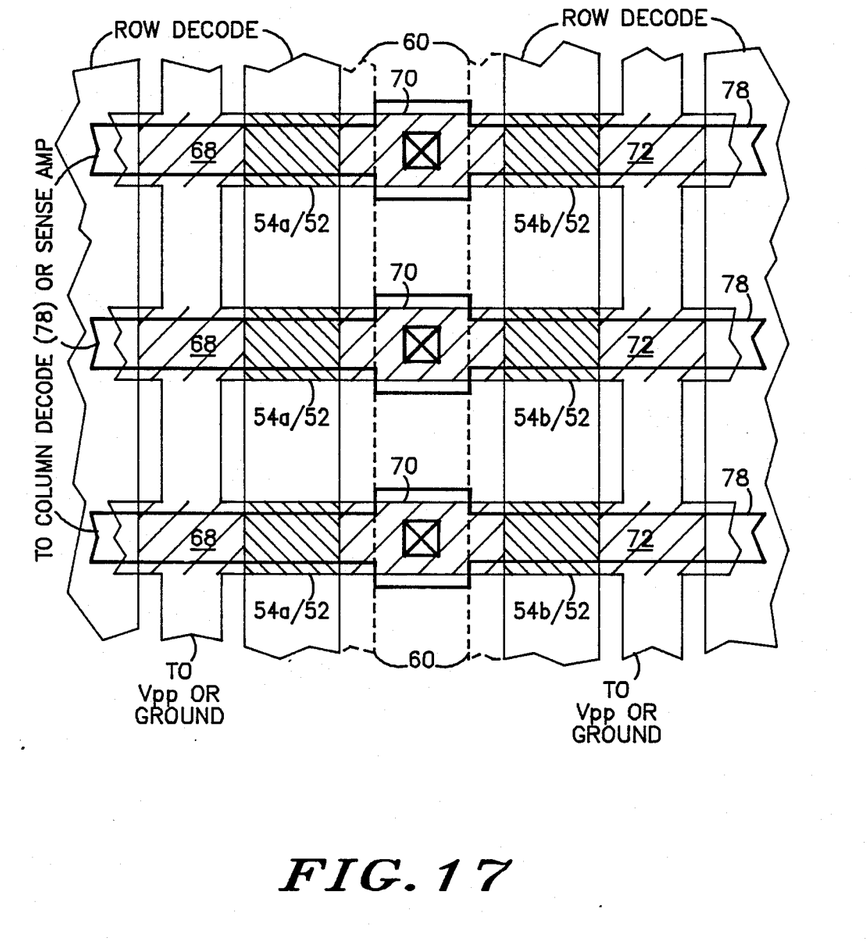
FIG. 17 shows a rough, schematic overhead layout of the EPROM cell of the present invention seen in FIG. 12; the structure shown in FIG. 16 could be implemented using this same layout.

Shown in FIG. 17 is a rough, schematic overhead layout of three of the EPROM cell A/cell B pairs illustrated in cross-section in FIG. 12 with the corresponding parts having the same reference numbers for clarity. It will be appreciated that the layout of FIG. 17 is only one possible layout and not necessarily an optimized layout. FIG. 17 is presented to illustrate how the cells may be arranged "back-to-back" with the spacers 60 on either side of the drain/source region 70.

Thus, it may be seen that the processes and structures of this invention provide EPROM cells that use spacer technology to deliberately create a non-overlap or "underlap" between the source/drain region and one side of the gate. In addition, this invention calls for use of the deliberate asymmetrical device to produce high gate currents with one orientation during a programming or write operation, and to produce high drain currents and low gate currents with the reverse orientation of the source/drain and drain/source regions during a read operation. The high gate currents during programming provide faster programming, while the high drain currents provide fast access.

Additionally, with conventional EPROM cells, at high $V_g$, there is a problem of accidental programming of the cell. However, in the present design, the gate current will be lower, as in configuration B, so that accidental programming is much less likely to occur with the cell of the present invention. Since the SI-EPROM cell produces relatively high gate currents during read, accidental programming, particularly of the conductive, charge-storing sidewall therein, may still occur. Thus, the SI-EPROM requires low $V_d$ during read. In the present invention, higher $V_d$ may be used, without the risk of accidental programming.

Both the EPROM cell of the present invention and the SI-EPROM cell deliver higher cell current than conventional EPROM cells. However, the structures of the present invention can achieve higher cell currents than the SI-EPROM configuration due to the reverse reading feature that it permits.

We claim:

1. An asymmetrical erasable programmable read only memory (EPROM) cell comprising:
   a semiconductor substrate having a surface;
   a source/drain region and a drain/source region in the semiconductor substrate spaced apart from each other by a channel between their inner edges;
   a gate dielectric material on the surface of the semiconductor substrate;
   a floating gate of conductive material on the gate dielectric material over the channel, and positioned such that the floating gate overlaps the inner edge of the drain/source region and is spaced apart from the inner edge of the source/drain region;
   a control gate of a conductive material positioned over and insulated from the floating gate;
   means for grounding the source/drain region and raising the drain/source and control gate to a positive potential during a write operation; and
   means for grounding the drain/source and ramping the voltage on the control gate during a read operation.

2. The EPROM cell of claim 1 wherein the semiconductor substrate is monocrystalline silicon, and the conductive material of the floating gate and the control gate is doped polycrystalline silicon.

3. The EPROM cell of claim 1 wherein a sidewall spacer exists on the thin dielectric layer between the floating gate and the source/drain region.

4. An asymmetrical erasable programmable read only memory (EPROM) cell comprising:
   a semiconductor substrate doped with an impurity of a first conductivity type and having a surface;
   a source/drain region and a drain/source region in the semiconductor substrate, where the source/drain region and the drain/source region are doped with an impurity of a second (semiconductor) conductivity type, and are spaced apart from each other by a channel between their inner edges;
   a gate dielectric material on the surface of the semiconductor substrate covering the channel;
   a floating gate of conductive material on the gate dielectric material over the channel, and positioned such that the floating gate overlaps the inner edge of the drain/source region and is spaced apart from the inner edge of the source/drain region;
   a control gate of a conductive material positioned over and insulated from the floating gate;
   means for grounding the source/drain region and raising the drain/source and control gate to a positive potential during a write operation; and
   means for grounding the drain/source and ramping the voltage on the control gate during a read operation.

5. The EPROM cell of claim 4 wherein the semiconductor substrate is monocrystalline silicon, and the conductive material of the floating gate and the control gate is doped polycrystalline silicon.

6. The EPROM cell of claim 4 wherein a sidewall spacer exists on the thin dielectric layer between the floating gate and the source/drain region.

7. A process for producing an asymmetrical erasable programmable read only memory (EPROM) cell comprising the steps of:
   providing a semiconductor substrate;
   providing a first dielectric layer over the semiconductor substrate;
   providing a floating gate of conductive material on the dielectric layer;
   providing a second dielectric layer over the floating gate;
   providing a control gate of conductive material over the floating gate and the second dielectric layer;
   providing an asymmetrical non-charge storing spacer having a greater width on a first side of the floating and control gates than on the second side of said gates being the opposite side; and
   providing a source/drain region in the substrate on the first side of the gates spaced apart from the gates from the gates by portion of the asymmetrical non-charge storing having a greater width, and providing a drain/source region in the substrate on the second side of the gates, overlapped by the gates.

8. The process of claim 7 wherein the non-charge storing spacer is of the material selected from the group consisting of silicon dioxide, silicon nitride and combinations thereof.

9. A process for producing an asymmetrical erasable programmable read only memory (EPROM) cell comprising the steps of:
   providing a semiconductor substrate doped with an impurity of a first conductivity type;
   forming a first dielectric layer over the semiconductor substrate;
   forming and patterning a floating gate of conductive material on the dielectric layer, a second dielectric layer over the conductive material for the floating gate, and a control gate of conductive material over the conductive material for the floating gate and the second dielectric layer;
   providing a dielectric spacer selectively on a first side of the floating and control gates, the second side of said gates being the opposite side;
   introducing a source/drain region in the substrate on the first side of the gates and spaced apart from the gates, and introducing a drain/source region in the substrate on the second side of the gates, where the drain/source region is overlapped by the gates and where the source/drain region and the drain/source region are of the second conductivity type; and
   providing means to ground the source/drain region to perform as the source during a write operation and means to ground the drain/source region to perform as the source during a read operation.

10. The process of claim 9 wherein the first dielectric layer, second dielectric layer and dielectric spacer are of materials selected from the group of dielectric materials consisting of silicon dioxide, silicon nitride, combinations of the two.

11. The process of claim 9 wherein the semiconductor substrate is monocrystalline silicon.

12. The process of claim 9 wherein the conductive material of the floating gate and the control gate is doped polycrystalline silicon.

13. A process for producing an asymmetrical erasable programmable read only memory (EPROM) cell comprising the steps of:

providing a semiconductor substrate doped with an impurity of a first conductivity type;

forming a first dielectric layer over the semiconductor substrate;

forming and patterning a floating gate of conductive material on the dielectric layer, a second dielectric layer over the conductive material for the floating gate, and a control gate of conductive material over the conductive material for the floating gate and the second dielectric layer;

providing dielectric spacers around the gates;

selectively removing a portion of the spacers, leaving the spacer on a first side of the floating and control gates, the second side of said gates without the spacer being the opposite side;

introducing a source/drain region in the substrate on the first side of the gates and spaced apart from the gates, and introducing a drain/source region in the substrate on the second side of the gates, where the drain/source region is overlapped by the gates and where the source/drain region and the drain/source region are of the second conductivity type; and providing means to ground the source/drain region to perform as the source during a write operation and means to ground the drain/source region to perform as the source during a read operation.

14. A process for producing an asymmetrical erasable programmable read only memory (EPROM) cell comprising the steps of:

providing a semiconductor substrate doped with an impurity of a first conductivity type;

forming a first dielectric layer over the semiconductor substrate;

forming and patterning floating gate of conductive material on the dielectric layer, a second dielectric layer over the conductive material for the floating gate, and a control gate of conductive material over the conductive material for the floating gate and the second dielectric layer;

introducing an impurity in the substrate on only a second side of the floating and control gates, an opposite side of the floating and control gates being the first side;

providing a dielectric spacer around all sides of the floating and control gates;

introducing a source/drain region in the substrate on the first side of the gates and spaced apart from the gates, and introducing a drain/source region in the substrate on the second side of the gates, where the drain/source region is overlapped by the gates and where the source/drain region and the drain/source region are of the second conductivity type; and providing means to enable the source/drain region to perform as the source during a write operation and means to enable the drain/source region to perform as the source during a read operation.

* * * * *

UNITED STATES PATENT AND TRADEMARK OFFICE
CERTIFICATE OF CORRECTION

PATENT NO. : 4,852,062
DATED : July 25, 1989
INVENTOR(S) : Frank K. Baker, James R. Pfiester and Charles F. Hart It is certified that error appears in the above-identified patent and that said Letters Patent is hereby corrected as shown below:

Column 10, line 24, change "by portion" to --by the portion--

Column 10, line 25, change "storing having" to --storing spacer having--

Signed and Sealed this

Twenty-first Day of August, 1990

Attest:

HARRY F. MANBECK, JR.

*Attesting Officer*     *Commissioner of Patents and Trademarks*